(12) United States Patent
Pavlovic et al.

(10) Patent No.: US 8,742,255 B2
(45) Date of Patent: Jun. 3, 2014

(54) HOUSING ASSEMBLY TO ENCLOSE AND GROUND AN ELECTRICAL SUBASSEMBLY

(75) Inventors: Slobodan Pavlovic, Novi, MI (US); Nadir Sharaf, Bloomfield Township, MI (US); Dilip Daftuar, West Bloomfield, MI (US); David Menzies, Linden, MI (US)

(73) Assignee: Lear Corporation, Southfield, MI (US)

( * ) Notice: Subject to any disclaimer, the term of this patent is extended or adjusted under 35 U.S.C. 154(b) by 212 days.

(21) Appl. No.: 13/307,950

(22) Filed: Nov. 30, 2011

(65) Prior Publication Data
US 2013/0135797 A1 May 30, 2013

(51) Int. Cl.
*H02G 3/08* (2006.01)
*H05K 7/00* (2006.01)

(52) U.S. Cl.
USPC ............ 174/50; 174/520; 174/51; 174/559; 361/679.01; 361/752

(58) Field of Classification Search
USPC ............ 174/50, 520, 53, 559, 5 R, 17 R, 480, 174/481, 51, 560, 59; 220/3.2–3.9, 4.02; 439/535, 536, 949; 361/600, 601, 361/679.01, 724, 736, 742, 752, 753, 796
See application file for complete search history.

(56) References Cited

U.S. PATENT DOCUMENTS

| | | | |
|---|---|---|---|
| 4,508,640 A | 4/1985 | Kanda et al. | |
| 5,412,024 A | 5/1995 | Okada et al. | |
| 5,491,892 A * | 2/1996 | Fritz et al. | 174/51 |
| 5,519,169 A * | 5/1996 | Garrett et al. | 174/51 |
| 5,639,989 A | 6/1997 | Higgins, III | |
| 5,740,015 A | 4/1998 | Donegan et al. | |
| 6,069,315 A * | 5/2000 | Tang | 174/50 |
| 6,313,991 B1 | 11/2001 | Nagashima et al. | |
| 6,733,345 B2 * | 5/2004 | Weise et al. | 174/50 |
| 6,839,240 B2 | 1/2005 | Skofljanec et al. | |
| 7,013,558 B2 * | 3/2006 | Bachman | 361/736 |
| 7,050,305 B2 | 5/2006 | Thorum | |
| 7,479,020 B2 | 1/2009 | Whitton | |
| 7,488,901 B2 | 2/2009 | Arnold | |
| 7,660,099 B2 | 2/2010 | Imamura et al. | |
| 7,726,440 B2 | 6/2010 | Aisenbrey | |
| 7,788,801 B2 | 9/2010 | Oggioni et al. | |
| 7,804,688 B2 | 9/2010 | Wakabayashi et al. | |

(Continued)

FOREIGN PATENT DOCUMENTS

JP 2005093515 A 4/2005
WO 2010144399 A2 12/2010

OTHER PUBLICATIONS

CurrentWays.com, "BC-Series 3kW 112—450 Volts IP67 Rated Liquid-Cooled EV Battery Charger", currentways Technologies, Oct. 20, 2011, 4 pages.

(Continued)

*Primary Examiner* — Angel R Estrada
(74) *Attorney, Agent, or Firm* — Brooks Kushman P.C.

(57) ABSTRACT

A housing assembly to enclose an electrical subassembly includes a housing formed from a conductive polymer. The housing has a cavity sized to receive an electronic sub-assembly therein. A conductive boss is insert-molded into the housing in conductive contact with the housing. A conductive bracket is fastened to the boss in conductive connection with the boss and the housing to support and electrically ground the housing.

21 Claims, 6 Drawing Sheets

(56) References Cited

U.S. PATENT DOCUMENTS

| | | | |
|---|---|---|---|
| 7,817,431 B2* | 10/2010 | Baker | 174/50 |
| 8,040,005 B2 | 10/2011 | Bhatti | |
| 8,471,145 B2* | 6/2013 | Suzuki | 174/50 |
| 2003/0175454 A1 | 9/2003 | Lichtenstein et al. | |
| 2003/0221849 A1 | 12/2003 | Pommerenke et al. | |
| 2007/0240867 A1 | 10/2007 | Amano et al. | |
| 2007/0246191 A1 | 10/2007 | Behrens et al. | |
| 2011/0214629 A1 | 9/2011 | Benoit | |
| 2011/0235276 A1 | 9/2011 | Hentschel et al. | |
| 2012/0100414 A1 | 4/2012 | Sonta | |

OTHER PUBLICATIONS www.delphi.com, "Delphi Universal On-board Battery Charger", Hybrid/Electrical Vehicle Products, Oct. 1, 2011, 1 page.

www.TDIPOWER.com, "Liquid Cooled Power Solutions for Electric & Hybrid Vehicles", TDI Power, 2008, 6 pages.

U.S. Appl. No. 13/307,942, "Charger Assembly and Electromagnetic Interference Shield Assembly", filed Nov. 30, 2011, 21 pages.

U.S. Appl. No. 13/307,222, "Charger Assembly With Heat Transfer Duct", filed Nov. 30, 2011, 16 pages.

\* cited by examiner

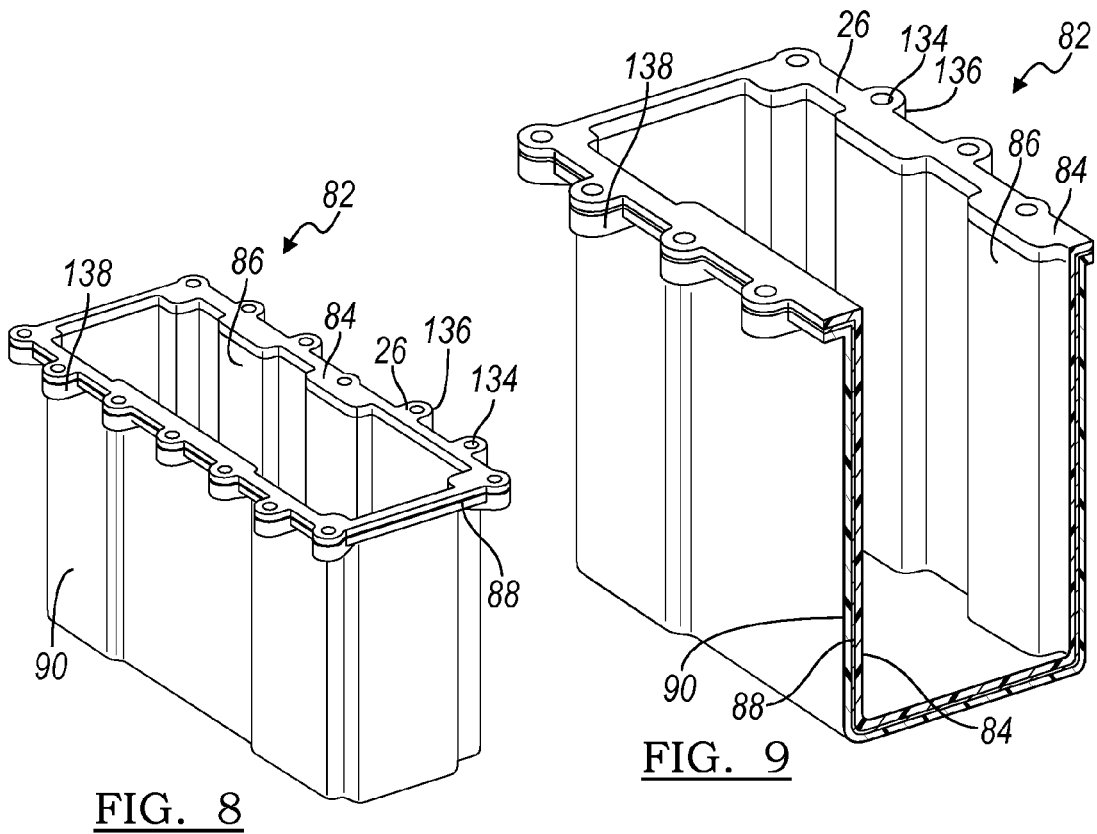
FIG. 8
FIG. 9
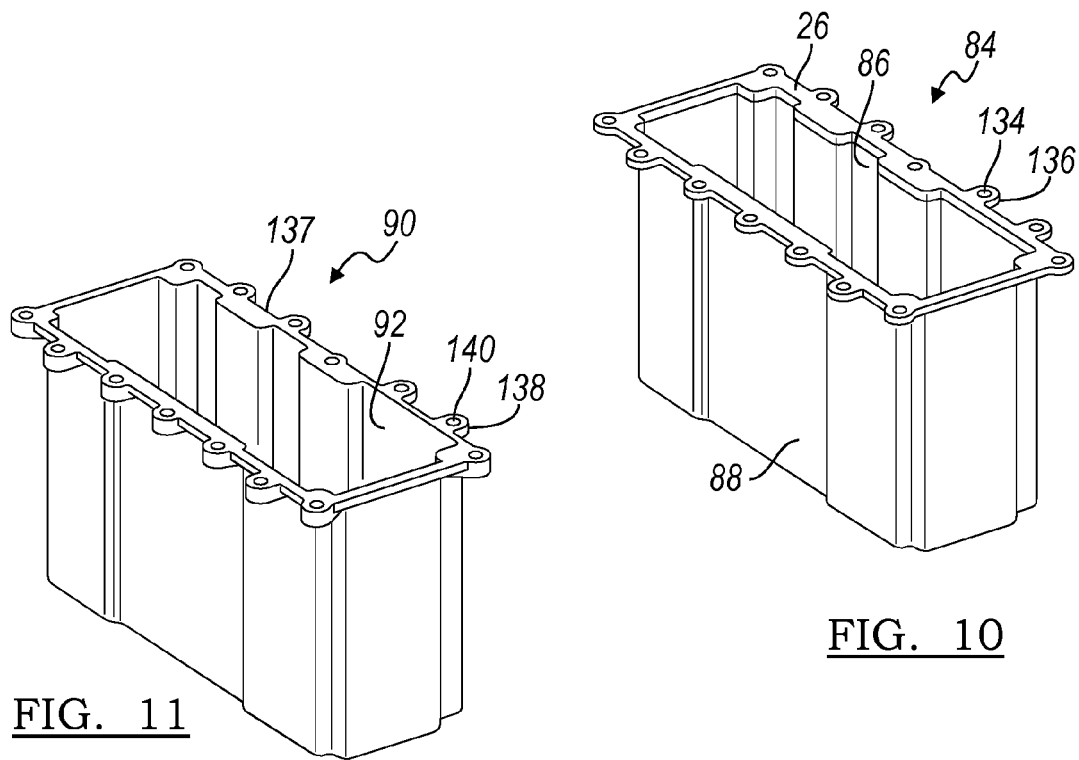
FIG. 11
FIG. 10

HOUSING ASSEMBLY TO ENCLOSE AND GROUND AN ELECTRICAL SUBASSEMBLY

TECHNICAL FIELD

Various embodiments relate to a housing assembly to enclose and ground an electrical subassembly.

BACKGROUND

In the advent of electric vehicles, hybrid electric vehicles, and any battery-powered vehicle, charger assemblies have been incorporated for charging the battery or batteries. Such charger assemblies often experience high voltages and are often utilized for converting alternating current to direct current. This conversion results in a high heat output and transmission of electromagnetic interference.

BRIEF DESCRIPTION OF THE DRAWINGS

FIG. 8 is a perspective view of an electromagnetic interference (EMI) shield assembly of the charger assembly of FIG. 1;

FIG. 9 is a fragmentary perspective view of the EMI shield assembly of FIG. 8;

FIG. 10 is a perspective view of a first housing of the EMI shield assembly of FIG. 8;

FIG. 11 is a perspective view of a second housing of the EMI shield assembly of FIG. 8;

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
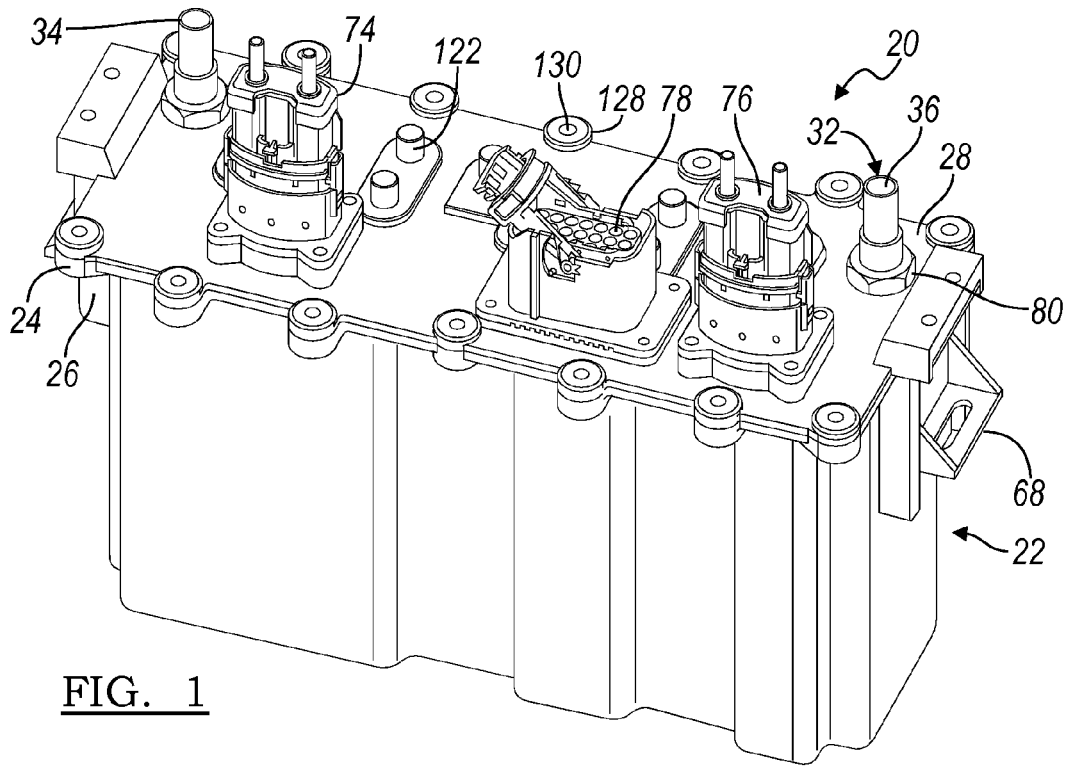
FIG. 1 is a perspective view of a charger assembly according to an embodiment.
Figure 2:
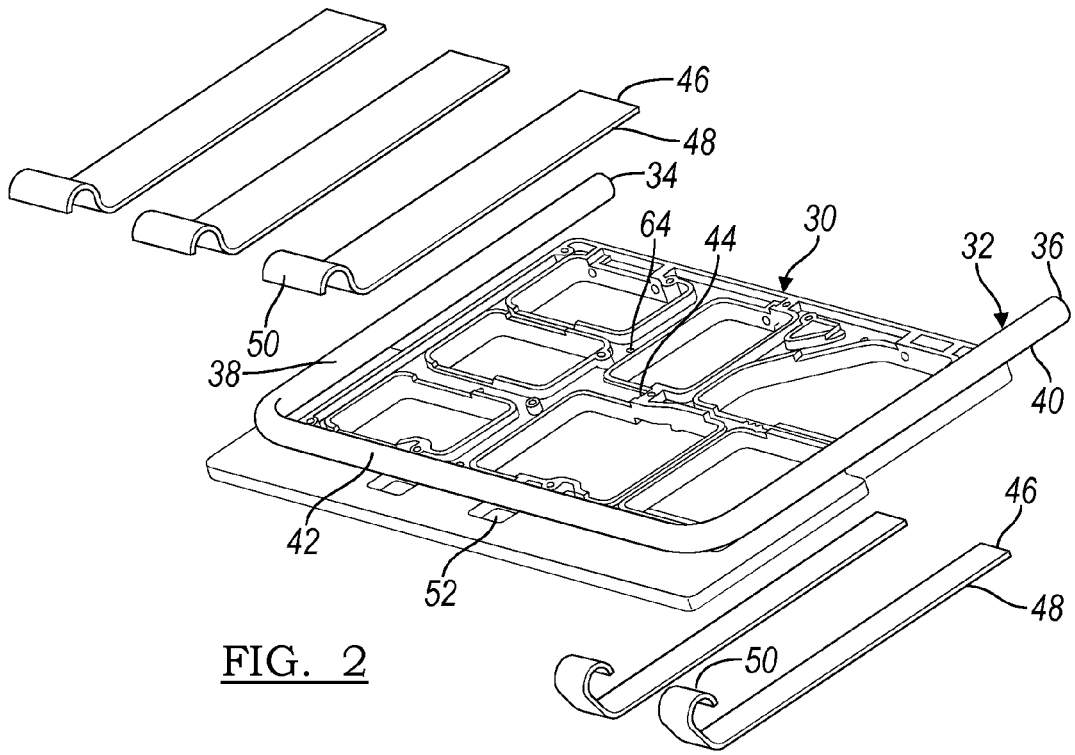
FIG. 2 is an exploded perspective view of heat transfer components of the charger assembly of FIG. 1.

Referring now to FIG. 1, a charger assembly is illustrated and referenced generally by numeral 20. The charger assembly 20, according to an embodiment, is an onboard charger, which is mounted to a vehicle body for charging a battery or batteries of the vehicle. Therefore, the size, shape, weight, rate of heat transfer, electromagnetic interference, durability and cost are all factors for the charger assembly 20 and the associated vehicle.

In the depicted embodiment, the charger assembly 20 has a housing 22. The housing 22 is generally hollow with a cavity therein for receiving components of the assembly 20. The housing 22 may be formed from any suitable material, such as aluminum, or a polymer. For the depicted embodiment, the housing 22 is formed from a conductive polymeric material. The housing 22 has an opening 24 for receiving components of the assembly 20 within the cavity. A mounting surface 26 is provided about the opening 24 for receiving a faceplate 28 fastened to the mounting surface 26.

Figure 3:
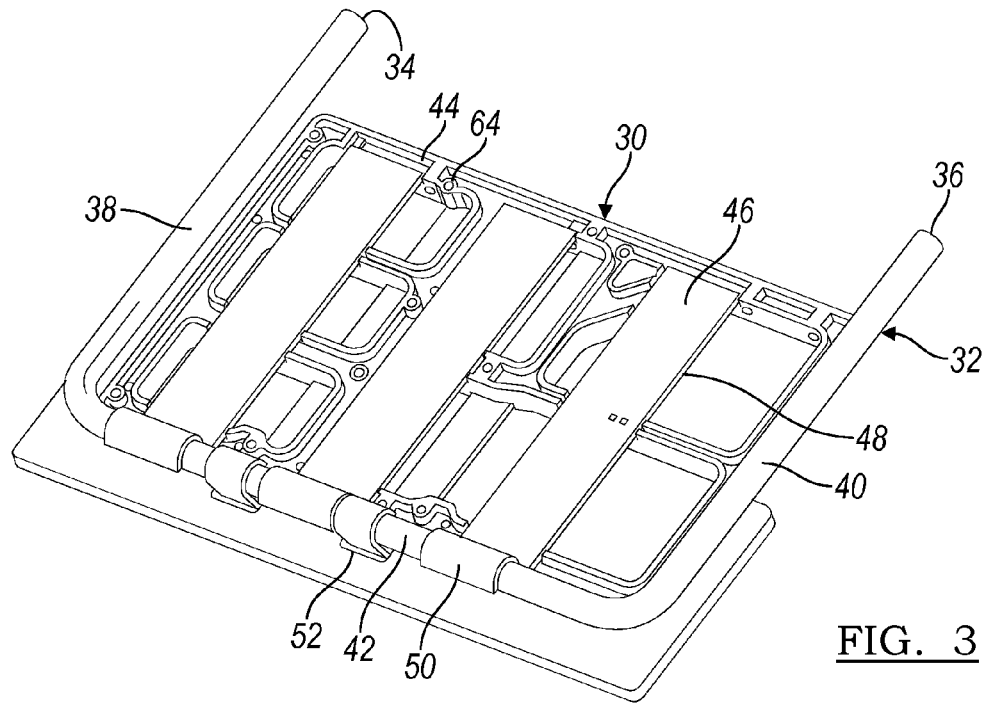
FIG. 3 is a perspective view of the heat transfer components of FIG. 2, illustrated assembled.

Referring now to FIG. 3, the charger assembly 20 includes a substrate 30. The substrate 30 may be formed of any suitable material such as plastic, aluminum, or the like. The substrate 30 is mounted to the cover 28 for being disposed within the cavity of the housing 22.

A heat transfer duct 32 is provided by a continuous bent piece of round tubing 32 for conveying fluid such as water or a coolant through the charger assembly 20. The tubing 32 has a pair of ends 34, 36 that extends through the cover 28 to provide an inlet and an outlet for the heat transfer duct 32. The tubing 32 extends straight in a depth direction from each of the ends 34, 36 for providing a pair of straight regions 38, 40 as inlet and outlet regions 38, 40. An intermediate region 42 extends between the straight regions 38, 40. The tubing 32 is formed from a continuous piece to avoid any fittings or connections within the charger assembly 20. The tubing 32 is placed upon the substrate 30. Of course, any pattern of the tubing 32 is contemplated.

The substrate 30 has a plurality of recesses 44 formed therein. The recesses 44 are aligned with high heat zones of associated circuit board assemblies. The recesses 44 are sized to receive a plurality of thermally conductive heat sinks 46. The heat sinks 46 may be formed from a thermally conductive material, such as copper, aluminum, heat pipe, or the like. Each heat sink 46 has a generally planar contact portion 48 for contact with the associated circuit board assembly. Each heat sink 46 also includes an arcuate, or curved, contact portion 50 that is contoured to the shape of the tubing 32 for an area contact with the tubing 32. The heat sinks 46 are not fastened to the substrate 30. The heat sinks 46 are placed within the recesses 44 upon the substrate 30 as illustrated in FIG. 3. Since the tubing 32 is displaced along one side of the substrate 30, the heat sinks 46 on the opposed side extend through apertures 52 so that the curved contact portions 50 engage the tubing 32.

Figure 4:
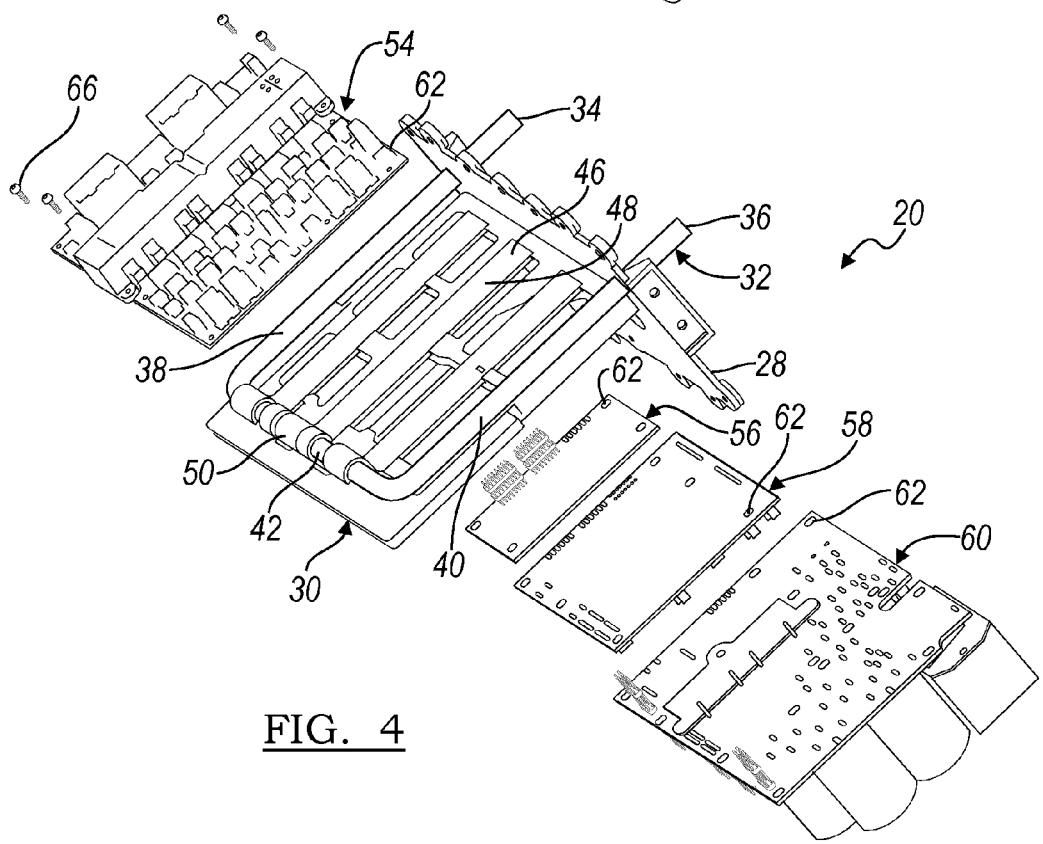
FIG. 4 is an exploded perspective view of the assembled heat transfer components of FIG. 3 and circuit board assemblies.

Referring now to FIG. 4, the cover 28 is assembled to the substrate 30 and the tubing 32. Also, a plurality of circuit board assemblies 54, 56, 58, 60 is assembled to both sides of the substrate 30. The circuit board assemblies 54, 56, 58, 60 each include an aperture pattern 62 that collectively corresponds with an aperture pattern 64 of the substrate 30 for receipt of fasteners 66 for assembling the circuit board assemblies 54, 56, 58, 60 to the substrate 30. By fastening the circuit board assemblies 54, 56, 58, 60 to the substrate 30, the heat sinks 46 are retained between each corresponding circuit board assembly 54, 56, 58, 60 and the substrate 30. The heat sinks 46 are aligned with high heat zones of the associated circuit board assemblies 54, 56, 58, 60 to transfer the heat from the circuit board assemblies 54, 56, 58, 60 to the tubing 32. By conveying a fluid through the tubing 32, the heat is transferred from the heat sinks 46 to the tubing 32, and consequently to the fluid within the tubing 32 for transferring the heat out of the charger assembly 20.

Although various circuit board assemblies 54, 56, 58, 60 are contemplated, the circuit board assemblies (PCBs) 54, 56, 58, 60 may each be provided on a printed circuit board. The circuit board assemblies 54, 56, 58, 60 may include power PCB, control PCB, and power factor correction PCB. Of course, various circuit board assemblies are contemplated.

Figure 5:
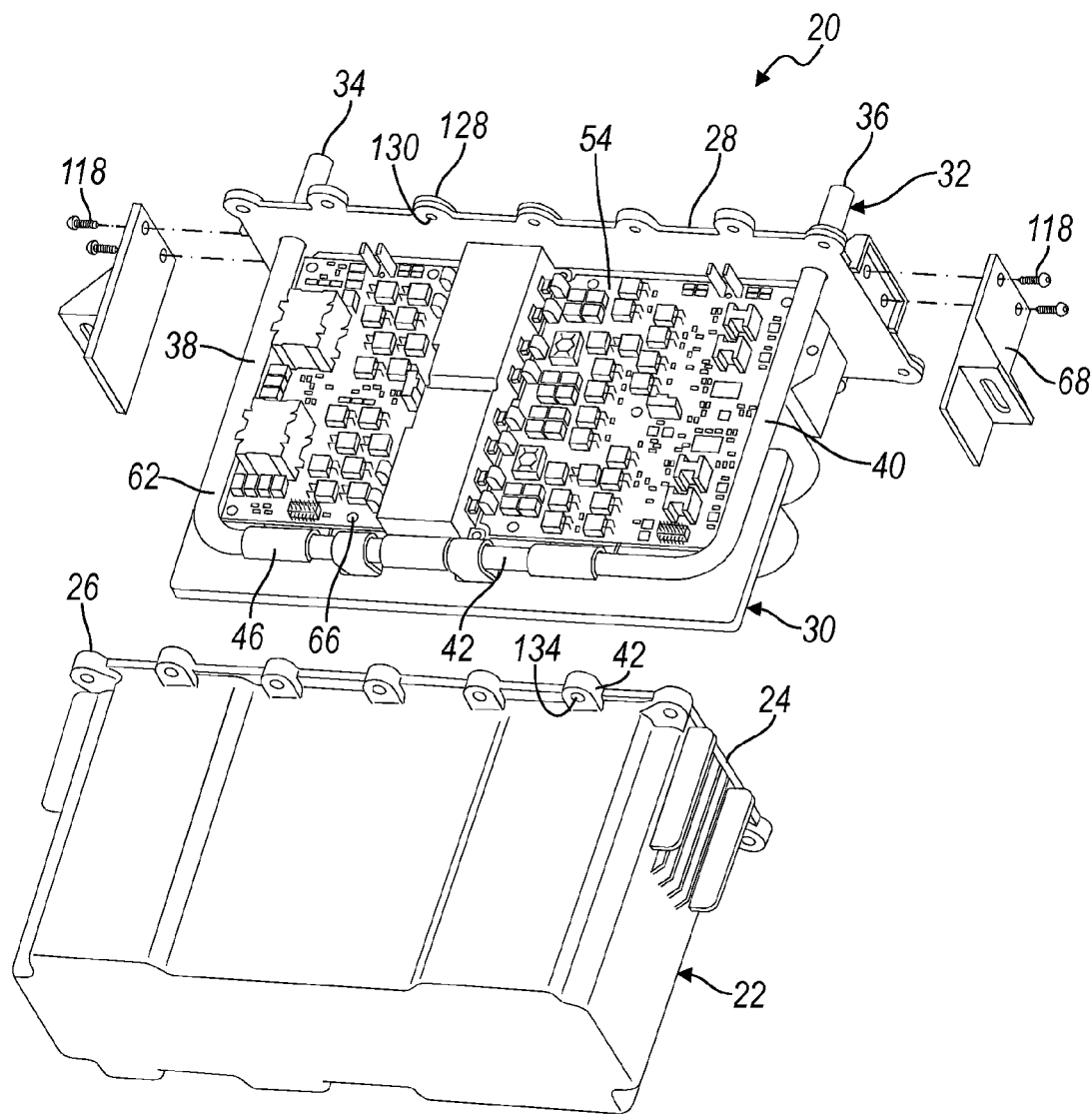
FIG. 5 is an exploded perspective view of the charger assembly of FIG. 1.

With reference now to FIG. 5, all of the components of the charger assembly 20 are assembled prior to being inserted into the housing 22. Thus, assembly of the components can occur at a location that is external of the housing 22. Therefore, accessibility to the various components is enhanced. Likewise, assembly does not occur within the housing 22 itself. In the depicted embodiment, the housing 22 has only one opening. The simplification is an enhancement over prior art charger assemblies that have various access openings and therefore various covers for access, assembly, and enclosing various components of the prior art charger assembly.

Figure 6:
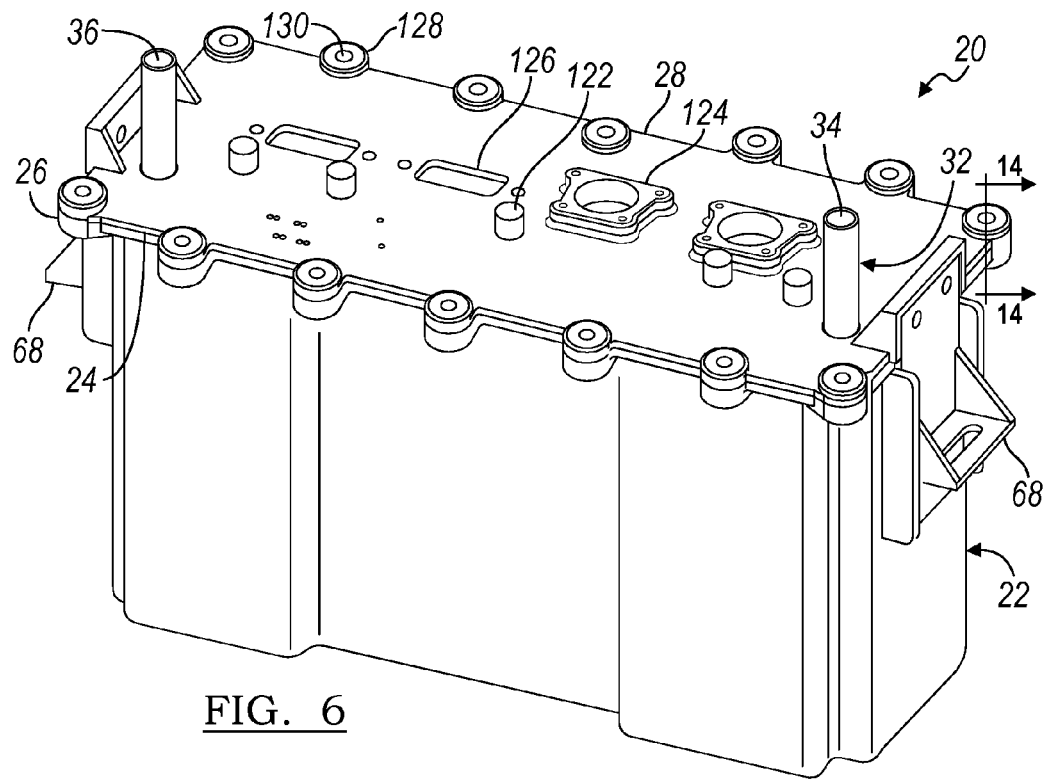
FIG. 6 is a perspective view of the charger assembly of FIG. 1, illustrated partially assembled.
Figure 7:
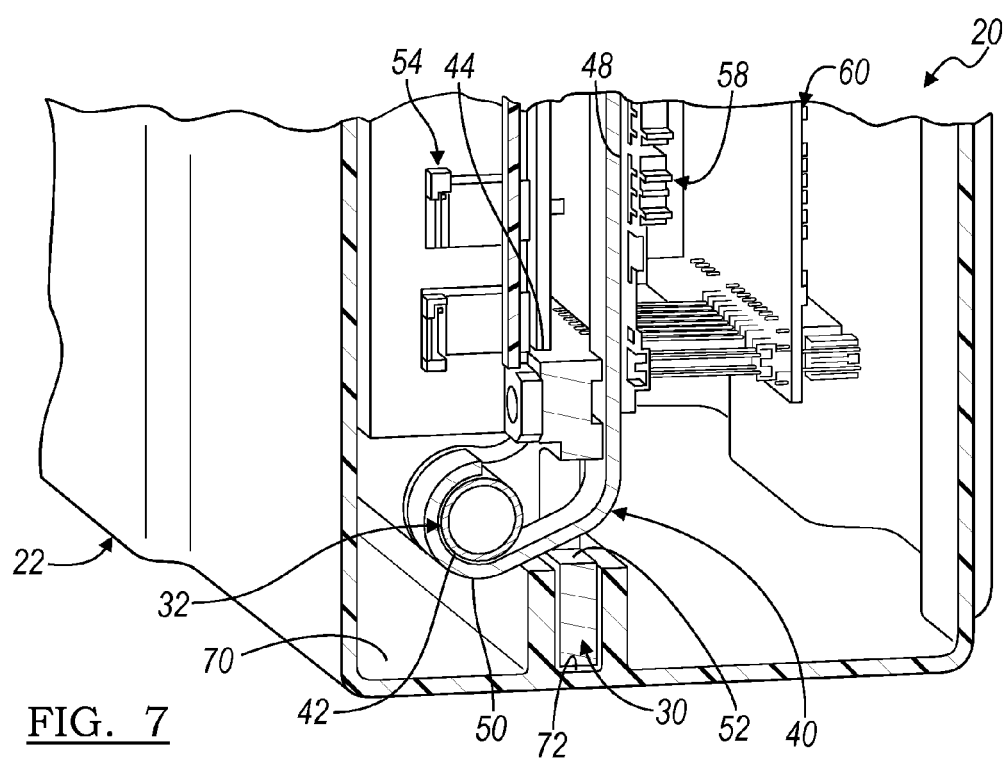
FIG. 7 is a section view of the charger assembly of FIG. 1.

FIG. 5 also illustrates a pair of mounting brackets 68 that are fastened to the cover 28 for supporting and fastening the charger assembly 20 to an underlying support structure, such as the vehicle body. The assembled cover 28, mounting brackets 68 and housing 22 are illustrated in FIG. 6. FIG. 7 illustrates a cross section of the charger assembly 20. The housing 22 includes a cavity 70 for receiving the components assembled to the cover 28. A channel 72 is formed within a bottom surface of the housing 22 for receiving a proximal end of the substrate 30.

Referring again to FIG. 1, a plurality of connectors is assembled to the cover 28 in electrical connection with the circuit board assemblies 54, 56, 58, 60. For example, two power connectors 74, 76 and one signal connectors 78 may be fastened to the cover 28. Additionally, fittings 80 may be provided on the tubing ends 34, 36 external of the housing 22.

As discussed above, the housing 22 may be provided from a conductive plastic material. The conductive plastic material may be utilized for shielding electromagnetic interference (EMI) and/or grounding of the charger assembly 20. Likewise, the relative flexibility of the housing 22 provides a sealed connection with the cover 28 so that an additional seal is not required in order to seal the components of the charger assembly 20 from external contaminants.

The packaging of the housing 22 permits simplified alignment and structure with all connections oriented in a common direction for accessibility, ease in assembly, and minimizing wiring, and permitting utilization of the housing 22 with only one opening 24.

Prior art charger assemblies often utilize a cast aluminum housing with multiple openings requiring multiple covers. Due to the inflexibility of cast aluminum, seals are required, which are less reliable than the connection provided by fastening the cover 28 to the mounting surface 26 of the housing 22. Therefore, leakage is reduced with the plastic housing 22, while weight is also reduced. For example, the depicted charger assembly 20 weighs generally 5 kilograms wherein the prior art charger assembly weighs approximately 7 kilograms. Additionally, a molded conductive plastic housing is cheaper due to materials' cost and manufacturing cost than a comparable cast aluminum housing, that requires machining afterword.

By utilization of the heat sinks 46, the heat can be conducted directly from the heat source to the tubing 32 thereby avoiding complicated tubing paths and geometries. By retaining the heat sinks 46 between the circuit board assemblies 54, 56, 58, 60 and the substrate 30, additional fasteners can be avoided.

FIGS. 8 and 9 illustrate an EMI shield assembly 82 which can be utilized as the housing 22 according to at least one embodiment. The EMI shield assembly 82 includes a first housing 84 having a cavity 86 for receiving an electronic sub-assembly, such as the charger assembly 20, therein. The first housing 84 provides the mounting surface 26 for the cover 28. The first housing 84 is also illustrated in FIG. 10. The first housing 84 is formed from a conductive polymer, such as a polyamide 66 with ten percent Nickel Coated Carbon fiber, for example. The first housing 84 has a wall thickness of approximately one millimeter according to at least one embodiment.

A metallic layer 88 is provided about the first housing 84. According to one embodiment, the first housing is coated with the metallic layer 88. The metallic layer 88 may be provided by aluminum foil according to at least one embodiment, or by a steel box according to at least another embodiment. The first housing 84 shields against high frequency EMI, such as a range of 20 Hertz to 1.73 MHertz.

The EMI shield assembly 82 also includes a second housing 90 with a cavity 92 for receiving the first housing 84 and the metallic layer 88 within the second housing cavity 92. The second housing is also illustrated in FIG. 11. Alternatively, the metallic layer 88 could be provided in the cavity 92 of the second housing 90 instead of being provided about the first housing 84.

The second housing 90 is formed from a conductive polymer, such as a polyamide 66 with thirty percent Stainless Steel fiber according to at least one embodiment. The second housing 90 shields against low frequency EMI within a range of twenty-five to one hundred Hertz. The second housing 90 has a wall thickness of approximately two millimeters according to at least one embodiment.

The EMI shield assembly 82 utilizes conductive polymers for enclosing high voltage electronic sub-assemblies, instead of aluminum, as in the prior art. The conductive polymers permit grounding of the housings 84, 90 while shielding a wide range of EMI from exiting, or entering the housings 84, 90. The EMI shield assembly 82 utilizes the housings 84, 90 with materials having different shielding properties over defined frequency ranges to meet full range shielding efficiency requirements for a given application. The metallic layer 88 further enhances the shielding effectiveness of the first housing 84 for preventing EMI of the charger assembly 20 from interfering with other components located near the charger assembly 20 while preventing EMI from other components from interfering with the charger assembly 20.

The housings 84, 90 collectively provide a high structural strength to meet applicable crush test stresses and stiffness requirements. The multiple polymer layers provided by the housings 84, 90 provide insulation of the charger assembly 20 from high temperatures that may be present in an environment under a hood of the vehicle. Additional thermal insulation may be provided between the housings 84, 90 according to at least one embodiment. The EMI shielding assembly 82 provides the housing 22 for the charger at a compact size, such as approximately 313 millimeters by 122 millimeters by 199 millimeters.

Figure 12:
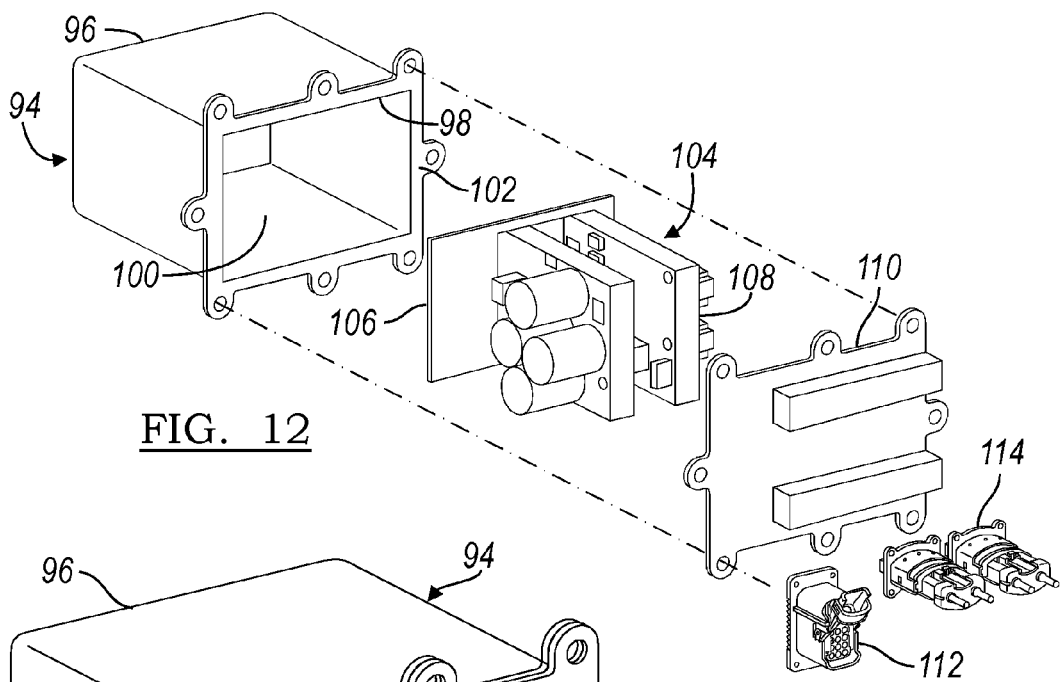
FIG. 12 is an exploded perspective view of another electronic assembly with an EMI shield assembly according to another embodiment.
Figure 13:
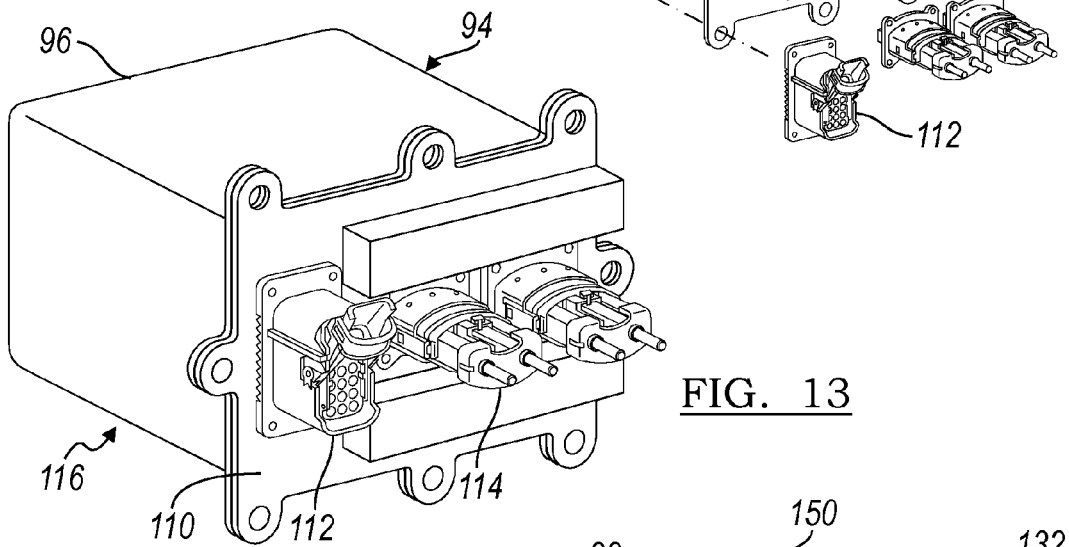
FIG. 13 is a perspective view of the electronic assembly of FIG. 12.

Of course, the EMI shielding assembly 82 may be utilized for various electronic subassemblies. FIGS. 12 and 13 illustrate another EMI shielding assembly 94 with a dual conductive plastic housing assembly 96 similar to the prior embodiment. The housings 96 provide a cavity 98 at an opening 100 with a mounting surface 102. A 3D card 104 with a printed circuit board 106 connected at a back plane with heat pipes 108 is disposed within the cavity 98 and enclosed by a cover 110 fastened to the mounting surface 102. A control fitting 112 and power fittings 114 are subsequently added to the cover 110. This assembly 82 permits a compact 3D PCB assembly 116 that is compact and optimizes strength, insulation, EMI shielding, and heat transfer. For example the EMI shield assembly 94 may be approximately 180 millimeters by 125 millimeters by 193 millimeters.

Referring again to FIG. 1, it is common to ground electrical components within a vehicle. Therefore, the brackets 68 are conductive for electrical grounding of the charger assembly 20 to the vehicle. The brackets 68 contact a vehicle body and therefore ground any short circuiting that may occur in the charger assembly 20. Referring now to FIGS. 1, 5 and 6, the brackets 68 are fastened directly to the cover 28 by fasteners 118. The cover 28 may be formed of a conductive material, such as aluminum, and provides a grounding plate for the components of the charger assembly 20. Accordingly, the cover 28 has interfaces 120 for providing a surface area contact with the brackets 68.

The cover 28 includes a plurality of grounding interfaces 122 for the circuit board assemblies 54, 56, 58, 60. Therefore, each of the circuit board assemblies 54, 56, 58, 60 is grounded to the cover 28. The cover 28 also includes a plurality of grounding interfaces 124 and 126 for connection and electrical grounding of the connectors 74, 76, 78. Of course, any arrangement of grounding interfaces is contemplated. For ease in assembly, each of the described grounding interfaces 120, 122, 124, 126 is provided on the cover 28 for access external of the housing 22.

The cover 28 includes a plurality of enlarged tabs 128 formed around its periphery. Each tab 128 is provided with an aperture 130 for securing the cover 28 to the housing 22. The housing 22, likewise includes a plurality of tabs 132 formed along the mounting surface 26, aligned with the tabs 128 of the cover 28. Each housing tab 132 has an aperture 134 for receiving a fastener.

With reference to FIGS. 8-11 and in the context of an embodiment wherein the housing 22 is a housing assembly 22 provided collectively by the first and second housings 84, 90, each of the housing tabs 132 may be provided collectively by both housings 84, 90. In another embodiment, the housing tabs 132 are provided on only one of the housings 84, 90.

In the depicted embodiment of FIGS. 8-11, the first housing 84 provides the mounting surface 26 for the cover. The first housing 84 includes a plurality of tabs 136 formed around the mounting surface 26. Each of the tabs 136 of the first housing 84 includes the aperture 134 formed therethrough. Likewise, the second housing 90 has a mounting surface 137 formed around the cavity 92 for receiving the tabs 136 of the first housing 84. The second housing 90 includes a plurality of tabs 138 formed around the mounting surface 137. Each tab 138 of the second housing 90 includes an aperture 140 formed therethrough. The tabs 136 and 138 of the first and second housings 84, 90 collectively provide the tabs 132 of the housing assembly 22.

Figure 14:
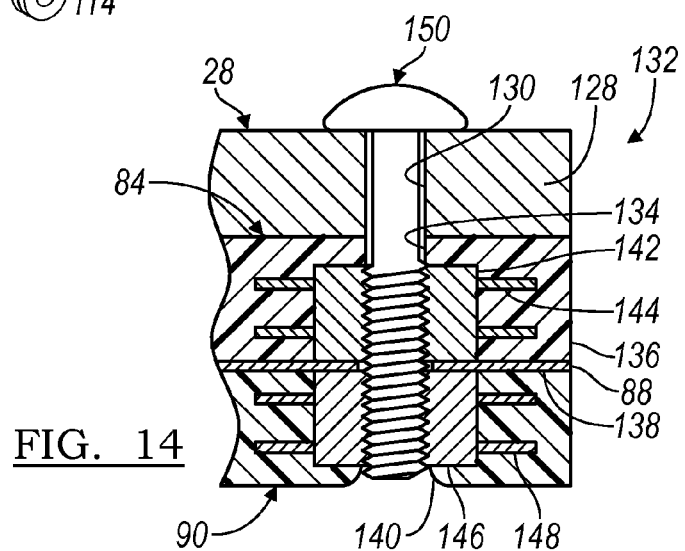
FIG. 14 is an enlarged section view taken from section line 14-14 in FIG. 6.

FIG. 14 illustrates a section view of the cover tab 128 and the housing tabs 136, 138 taken across section line 14-14 in FIG. 6. The first housing 84 includes a plurality of conductive bosses 142 that are each insert-molded into one of the tabs 136. The bosses 142 provide an electrical connection with conductive fibers within the conductive polymer material of the first housing 84. Molded conductive plastics often have a resistant or non-conductive surface or skin due to the flow of the fibers during a molding operation. By overmolding the first housing 84 to the bosses 142, the surface is penetrated by the bosses 142 thereby providing electrical contact between the fibers and the bosses 142. This contact can be enhanced by serrations, splines, or the like formed on an external surface of the bosses. In the depicted embodiment, copper strand wires 144 are connected externally to the bosses 142 for extending into the material of the first housing 84 and further enhancing electrical contact with the fibers within the material.

According to at least one embodiment, the second housing 90 also includes a plurality of conductive bosses 146 that are each insert-molded into one of the tabs 138. Likewise, the bosses 146 provide electrical contact with the fibers in the conductive plastic material of the second housing 90. The bosses 146 may also include copper strand wires 148 for enhancing the electrical contact of the bosses 146 and the fibers within the material.

A plurality of conductive fasteners, such as screws 150, is provided for securing the cover 28 to the housings 84, 80. Each screw 150 extends through the aperture 130 in the cover 28 and engages the corresponding bosses 142, 146 of the first and second housings 84, 90. Additionally, the screws 150 provide an electrical connection between the cover 28 and the bosses 142, 146 for providing an electrical connection between the housings 84, 90 and the cover 28. Therefore, the housings 84, 90 are also grounded to the cover 28, and consequently to the brackets 68.

The metallic layer 88 between the first and second housings 84, 90 is in direct electrical contact with one or both of the bosses 142, 146 for an electrical grounding connection with the screws 150 and consequently the cover 28 and brackets 68. Alternatively, the screws 150 may directly contact the metallic layer 88.

According to at least one embodiment, seals may be provided between the cover 28 and the first housing 84 and/or between the first housing 84 and the second housing 90 to limit exposure of the bosses 142, 146 to external contaminants and to avoid contact degradation from environmental exposure.

The grounding interfaces between the housings 84, 90 and the brackets 68 provide maximum ground current capability through the shield assembly 94 with low resistance contact between the housings 84, 90 and the cover 28. The grounding system depicted is adequate for ground 10 Amps continuously and 20 Amp surges through the cover plate 28.

For utilization of multiple charger assemblies 20 within a vehicle, grounding resistance of a wire shield from one cover 28 to another cover 28 is less than 1 milliohm. One milliohm ground circuit resistance for wiring shielding is achieved by utilization of parallel circuits (increased effective surface for transfer of ground circuit currents that are high frequency and are using only conductor surface for transfer—skin effect) and by enhanced interfaces between connectors 74, 76, 78, wire shields and cover plates 28. In case of bundle shielding, a bundle shield is engineered using right materials and conducting cross sections and lengths to meet maximum 1 milliohm ground circuit resistance.

A surface of engaged fibers within the conductive plastics may be controlled by turbulence induced in molding process by shape and construction of the bosses 142, 146. Distribution of the conductive fibers in the molded wall is effected by turbulence introduced in mold flow via gate design and by reduced back pressure which allows faster mold flow through the gate and higher turbulence. Contact resistance between the bosses 142, 146 and conductive fibers is effected by conductive fibers concentration as well as with distribution.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A housing assembly to enclose and ground an electrical subassembly comprising:
   a housing formed from a conductive polymer, the housing having a cavity sized to receive an electronic sub-assembly therein;
   a conductive boss insert-molded into the housing in conductive contact with the housing; and
   a conductive bracket fastened to the boss in conductive connection with the boss and the housing to support and electrically ground the housing;
   wherein the boss comprises at least one extension extending into the conductive polymer of the housing; and
   wherein the extension comprises copper wire.

2. The housing assembly of claim 1 wherein the housing has a mounting surface oriented around an opening to the cavity; and
   wherein the boss comprises an array of bosses oriented around the mounting surface.

3. The housing assembly of claim 1 further comprising:
   a conductive cover mounted to the housing to enclose the cavity; and
   a conductive fastener extending through an aperture in the cover in conductive contact with the boss to fasten the cover to the housing.

4. The housing assembly of claim 3 wherein the conductive bracket is fastened directly to the cover.

5. The housing assembly of claim 3 further comprising an electrical subassembly in electrical connection with the cover to ground the electrical subassembly.

6. The housing assembly of claim 5 wherein the electrical subassembly comprises a vehicle battery charger.

7. The housing assembly of claim 1 wherein the housing is defined as a first housing; and
   wherein the housing assembly further comprises a second housing formed of a conductive polymer, the second housing having a cavity sized to receive the first housing therein, the second housing being in conductive connection with the bracket.

8. The housing assembly of claim 7 wherein the boss is further defined as a first boss; and
   wherein the housing assembly further comprises a second conductive boss insert-molded into the second housing in conductive contact with the second housing.

9. The housing assembly of claim 8 further comprising:
   a conductive cover mounted to the first housing to enclose the cavity of the first housing; and
   a conductive fastener extending through an aperture in the cover in conductive contact with the first and second bosses to fasten the cover to the first and second housings.

10. The housing assembly of claim 8 further comprising a metallic layer oriented between the first housing and the second housing, the metallic layer being in conductive contact with one of the first and second bosses.

11. The housing assembly of claim 8 wherein the first housing has a first mounting surface oriented around an opening to the cavity of the first housing;
   wherein the first boss comprises an array of first bosses oriented around the first mounting surface;
   wherein the second housing has a second mounting surface oriented around an opening to the cavity of the second housing; and
   wherein the second boss comprises an array of second bosses oriented around the second mounting surface.

12. The housing assembly of claim 11 further comprising:
   a conductive cover mounted to the first housing to enclose the cavity of the first housing; and
   a plurality of conductive fasteners each extending through an aperture in the cover in conductive contact with the one of the first bosses and one of the second bosses to fasten the cover to the first and second housings.

13. A housing assembly to enclose and ground an electrical subassembly comprising:
   a housing formed from a conductive polymer, the housing having a cavity sized to receive an electronic sub-assembly therein, with a mounting surface oriented around an opening to the cavity;
   an array of conductive bosses insert-molded into the housing each boss comprising at least one extension extending into the conductive polymer of the housing in conductive contact with the housing;
   a conductive cover in contact with the mounting surface to enclose the cavity;
   an electrical subassembly in electrical connection with the cover to ground the electrical subassembly;
   a plurality of conductive fasteners each extending through an aperture in the cover in conductive contact with one of the bosses to fasten the cover to the housing; and
   a conductive bracket fastened directly to the cover to support and electrically ground the housing.

14. The housing assembly of claim 13 wherein the electrical subassembly comprises a vehicle battery charger.

15. A housing assembly to enclose and ground an electrical subassembly comprising:
   a first housing formed from a conductive polymer, the first housing having a cavity sized to receive an electronic sub-assembly therein, with a first mounting surface oriented around an opening to the cavity;
   an array of conductive first bosses insert-molded into the first housing, the array of first bosses being oriented around the first mounting surface, each first boss comprising at least one extension extending into the conductive polymer of the first housing in conductive contact with the first housing;
   a second housing formed of a conductive polymer, the second housing having a cavity sized to receive the first housing therein, with a second mounting surface oriented around an opening to the cavity;
   an array of conductive second bosses insert-molded into the second housing, the array of second bosses being oriented around the second mounting surface, each second boss comprising at least one extension extending into the conductive polymer of the second housing in conductive contact with the second housing;
   a conductive cover in contact with the first mounting surface to enclose the cavity of the first housing;
   an electrical subassembly disposed in the cavity of the first housing, in electrical connection with the cover to ground the electrical subassembly; and
   a plurality of conductive fasteners each extending through an aperture in the cover in conductive contact with one of the first bosses and one of the second bosses to fasten the cover to the first housing.

16. The housing assembly of claim 15 wherein the electrical subassembly comprises a vehicle battery charger.

17. The housing assembly of claim 15 further comprising a metallic layer oriented between the first housing and the second housing, the metallic layer being in conductive contact with one of the first and second bosses.

18. The housing assembly of claim 15 further comprising a conductive bracket fastened directly to the cover to support and electrically ground the first housing and second housing.

19. A housing assembly to enclose and ground an electrical subassembly comprising:
- a housing formed from a conductive polymer, the housing having a cavity sized to receive an electronic sub-assembly therein;
- a conductive boss insert-molded into the housing in conductive contact with the housing;
- a conductive bracket fastened to the boss in conductive connection with the boss and the housing to support and electrically ground the housing;
- a conductive cover mounted to the housing to enclose the cavity; and
- a conductive fastener extending through an aperture in the cover in conductive contact with the boss to fasten the cover to the housing;
- wherein the conductive bracket is fastened directly to the cover.

20. A housing assembly to enclose and ground an electrical subassembly comprising:
- a housing formed from a conductive polymer, the housing having a cavity sized to receive an electronic sub-assembly therein;
- a conductive boss insert-molded into the housing in conductive contact with the housing;
- a conductive bracket fastened to the boss in conductive connection with the boss and the housing to support and electrically ground the housing;
- a conductive cover mounted to the housing to enclose the cavity;
- a conductive fastener extending through an aperture in the cover in conductive contact with the boss to fasten the cover to the housing; and
- an electrical subassembly in electrical connection with the cover to ground the electrical subassembly.

21. A housing assembly to enclose and ground an electrical subassembly comprising:
- a housing formed from a conductive polymer, the housing having a cavity sized to receive an electronic sub-assembly therein;
- a conductive boss insert-molded into the housing in conductive contact with the housing; and
- a conductive bracket fastened to the boss in conductive connection with the boss and the housing to support and electrically ground the housing;
- wherein the housing is defined as a first housing; and
- wherein the housing assembly further comprises a second housing formed of a conductive polymer, the second housing having a cavity sized to receive the first housing therein, the second housing being in conductive connection with the bracket.

* * * * *